United States Patent
Yang et al.

(10) Patent No.: US 6,521,545 B1
(45) Date of Patent: Feb. 18, 2003

(54) METHOD OF A SURFACE TREATMENT ON A FLUORINATED SILICATE GLASS FILM

(75) Inventors: Neng-Hui Yang, Hsin-Chu (TW); Chinh-Fu Lin, Taipei (TW); Yi-Fang Cheng, Yun-Lin Hsien (TW); Cheng-Yuan Tsai, Yun-Lin Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/682,822

(22) Filed: Oct. 23, 2001

(51) Int. Cl.[7] .................. H01L 21/26; H01L 21/42; H01L 21/31; H01L 21/469
(52) U.S. Cl. .............. 438/763; 438/513; 438/770; 438/788
(58) Field of Search ................ 438/513, 763, 438/774, 787, 788, 770

(56) References Cited

U.S. PATENT DOCUMENTS

| | | | | |
|---|---|---|---|---|
| 6,103,601 A | * | 8/2000 | Lee et al. | 438/513 |
| 6,180,540 B1 | * | 1/2001 | Jang et al. | 438/784 |
| 6,284,644 B1 | * | 9/2001 | Aug et al. | 438/623 |
| 6,300,672 B1 | * | 10/2001 | Lee | 257/641 |
| 6,335,274 B1 | * | 1/2002 | Wu et al. | 438/626 |
| 6,374,770 B1 | * | 4/2002 | Lee et al. | 118/723 |

* cited by examiner

*Primary Examiner*—Alexander Ghyka
(74) *Attorney, Agent, or Firm*—Winston Hsu

(57) ABSTRACT

The invention shows a method of a surface treatment on a fluorine silicate glass film. At first a fluorine silicate glass layer is deposited on a semiconductor wafer. Partial fluorine ions in the fluorine silicate glass layer are in-situ removed to form a silicon oxide layer of a pre-determined thickness. Then, a photoresist layer is coated on the silicon oxide layer. After an exposing process, a pre-determined latent pattern is formed in the photoresist layer. Finally, after a developing process, the pre-determined latent pattern of the photoresist is removed so as to expose corresponding portions of the silicon oxide layer underneath the latent pattern of the photoresist layer. As a result, the present invention solves a problem that fluorine ions in the fluorine silicate glass layer 24 diffuse to a surface of the fluorine silicate glass layer 24 to combine with water to form hydrofluoric acid, that contaminates the photoresist and leads to reliability issues.

11 Claims, 5 Drawing Sheets

Table 1

| | Thickness (Å) | NU(%) at 1 sigma[c] | RI[d] | Si-F/Si-O (%)[e] | Dielectric constant |
|---|---|---|---|---|---|
| PEFSG[a] | 5060 | 0.82 | 1.4321 | 2.37 | 3.56 |
| PEFSG (N$_2$O plasma)[b] | 5046 | 0.82 | 1.4323 | 2.37 | 3.57 |

[a] PEFSG is the fluorine silicate glass without any treatment.
[b] PEFSG (N$_2$O plasma) is the fluorine silicate glass film with an oxygen-plasma treatment.
[c] NU% is the non-uniformity(1 sigma %).
[d] RI is the refractive index.
[e] Si-F/Si-O(%) is the peak-height, which is measured by FTIR, ratio of Si-F to Si-O.

METHOD OF A SURFACE TREATMENT ON A FLUORINATED SILICATE GLASS FILM

BACKGROUND OF INVENTION

1. Field of the Invention

The present invention relates to a method of a surface treatment, and more particularly, to a method of a surface treatment on a fluorinated silicate glass (FSG) film.

2. Background of the Invention

With the decreasing size of semiconductor devices and an increase in integrated circuits (IC) density, an intermetal dielectric layer must have certain characteristics such as a low dielectric constant, good gap-filling properties, good mechanical stability and a low water absorption capability, etc. In addition, a reduction in the dielectric constant of an intermetal dielectric layer can enhance the speed of transmitting signals due to a related reduction in a parasitic capacitance between metal wires. Silicon dioxide is a typical dielectric material but its dielectric constant (k~4) is too high for present semiconductor fabrication. As a result, a material with lower dielectric constant such as FSG (k~3.5) is required to replace silicon dioxide as an intermetal dielectric layer. Since fluorine is an electronegative atom, it can effectively reduce polarizability in a SiOF network of silicon dioxide and therefore reduce the dielectric constant of silicon dioxide. Additionally, fluorine is a strong etching species and it will etch the deposited FSG film to produce a deposition/etching effect. Moreover, a void-free FSG film is obtained in semiconductor fabrication with a thinner line width.

Please refer to FIG. 1 to FIG. 3, FIG. 1 to FIG. 3 are schematic diagrams of a prior method of forming a patterned photoresist on a fluorinated silicate glass (FSG) film. As shown in FIG. 1, a semiconductor wafer 10 comprises a substrate 12, a fluorine silicate glass layer 14 deposited on the substrate 12 and a photoresist layer 16 coated on the fluorine silicate glass layer 14. As shown in FIG. 2, exposing the photoresist layer 16 forms a pre-determined latent pattern 16a in the photoresist layer 16. As shown in FIG. 3, developing the photoresist layer 16, that is known by those skilled in the art, removes the pre-determined latent pattern 16a to expose corresponding portions of the fluorine silicate glass layer 14 underneath the pre-determined latent pattern 16.

Adding fluorine ions into silicon dioxide obtains a fluorine silicate glass film with a lower dielectric constant. However, fluorine ions in the fluorine silicate glass layer 14 are not stable meaning they might diffuse to the surface of the fluorine silicate glass layer 14. In addition, the fluorine silicate glass is so hydrophilic that it absorbs water molecules that react with the fluorine ions to form hydrofluoric acid (HF) on the surface of the fluorine silicate glass. Hydrofluoric acid reacts with the photoresist layer 16 and contaminates the photoresist, which leads to a formation of non-vertical sidewalls of exposed photoresist and moreover leads to collapse of exposed photoresist (as shown in FIG. 3). These effects cause imperfect transfer of the photoresist pattern to the semiconductor wafer. Additionally, hydrofluoric acid corrodes metal wires, which increases metal resistivity and causes reliability issues in integrated circuits.

SUMMARY OF INVENTION

It is therefore a primary objective of the present invention to provide a method of a surface treatment on a fluorine silicate glass film to solve the above mentioned problems.

The present invention provides a method of a surface treatment on a fluorine silicate glass film; the method involves depositing a fluorine silicate glass layer on a semiconductor wafer. In-situ removing fluorine ions from an upper surface of the fluorine silicate glass film to form a silicon oxide layer of a pre-determined thickness, and coating a photoresist layer on the silicon oxide layer. The photoresist layer is exposed to form a pre-determined latent pattern in the photoresist layer. The layer is developed and the pre-determined latent pattern of the photoresist is removed so as to expose corresponding portions of the silicon oxide layer underneath the latent pattern of the photoresist layer.

The present invention utilizes an oxygen-containing plasma to in-situ remove fluorine ions from an upper surface of the fluorine silicate glass film to form a silicon oxide layer of a thickness between 100 and 200 Å. The method has the following advantages. (1) In-situ removing fluorine ions of the fluorine silicate glass film does not change the physical properties of the fluorine silicate glass film, such as thickness, refractive index and dielectric constant. (2) The thin silicon oxide layer, produced by the oxygen-containing plasma, prevents fluorine ions in the fluorine silicate glass from out-diffusion. (3) In-situ removing fluorine ions of the fluorine silicate glass film reduces the water absorption capability of the fluorine silicate glass. (4) Compared with depositing a silicon dioxide layer and a silicon oxynitride (SiON) layer to prevent fluorine ions in the fluorine silicate glass from out-diffusion in the prior art, the present invention has further advantages of reducing process steps and saving production cost.

These and other objectives and advantages of the present invention will no doubt become obvious to those of ordinary skill in the art after having read the following detailed description of the preferred embodiment that is illustrated in the various figures and drawings.

Table 1 gives a comparison of the physical properties between PEFSG and PEFSG ($N_2O$ plasma).

DETAILED DESCRIPTION

Figure 1:
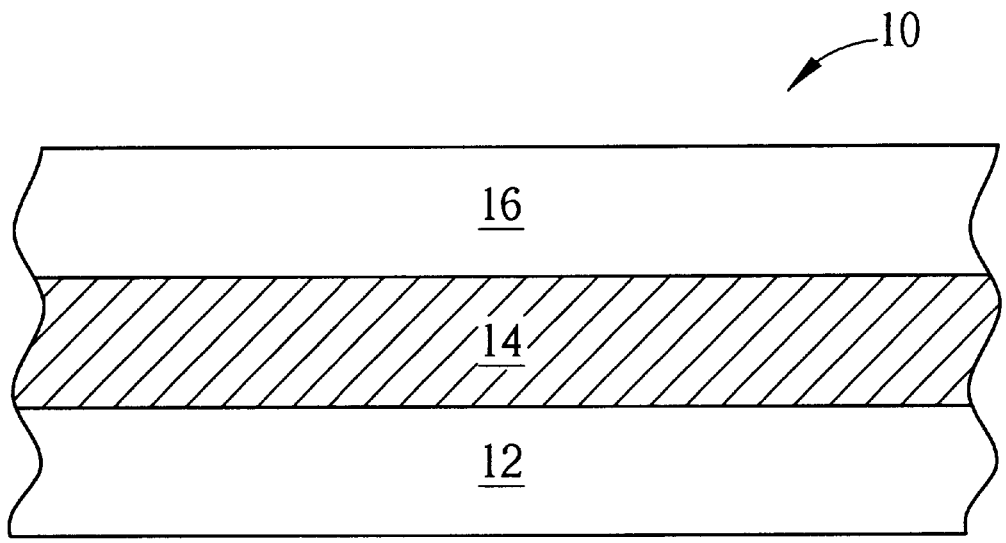
FIG. 1 to FIG. 3 are schematic diagrams of a prior method of forming a patterned photoresist on a fluorine silicate glass film.
Figure 2:
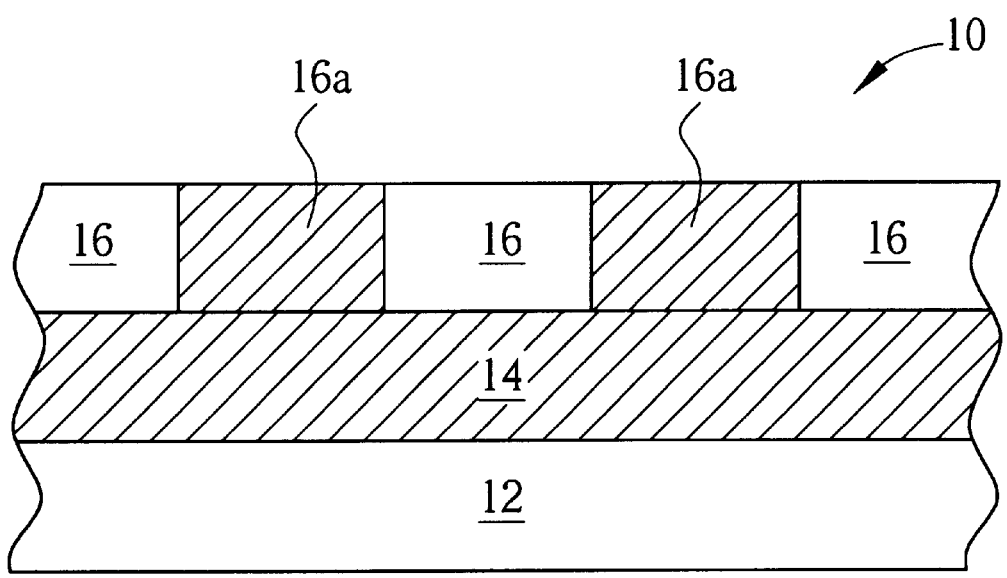
Figure 3:
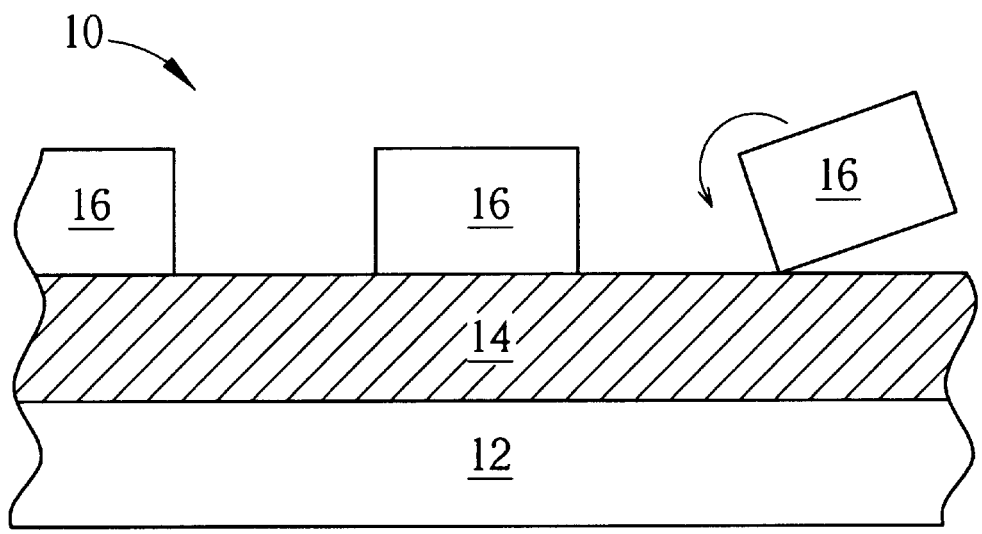
Figure 4:
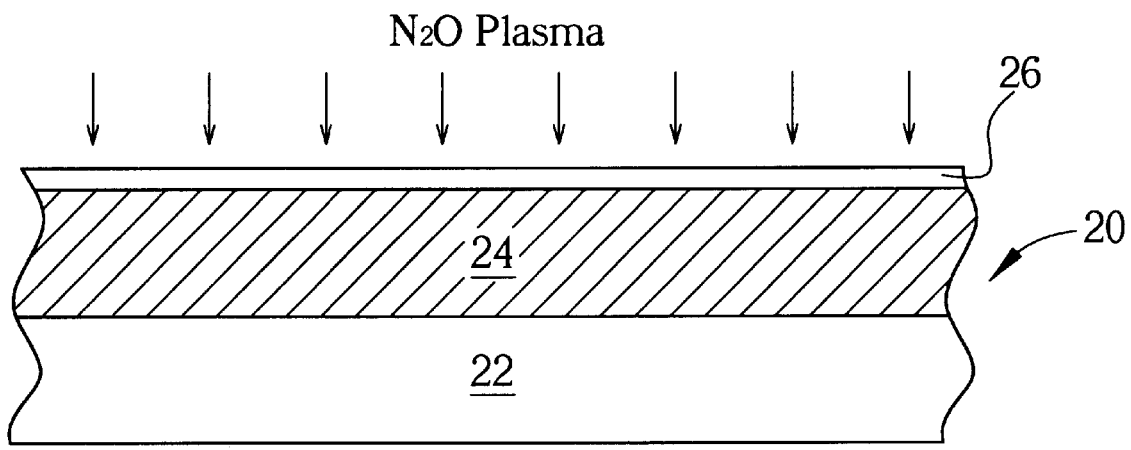
FIG. 4 to FIG. 5 are schematic diagrams of a method of forming the patterned photoresist on the fluorine silicate glass film according to the present invention.
Figure 5:
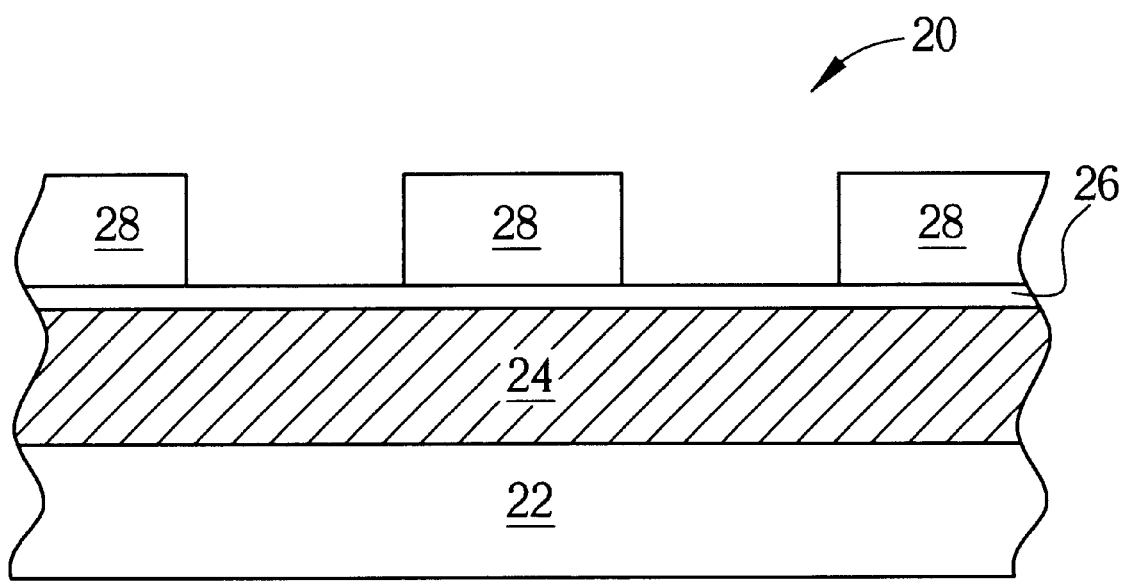

Please refer to FIG. 4 and FIG. 5. FIG. 4 and FIG. 5 are schematic diagrams of a method of forming a patterned photoresist on a fluorine silicate glass film according to the present invention. As shown in FIG. 4, a semiconductor wafer 20 comprises a substrate 22, a fluorine silicate glass layer 24 deposited on the substrate 22. In the preferred embodiment of the present invention, the fluorine silicate glass layer 24 is formed by utilizing a plasma-enhanced chemical vapor deposition (PECVD) and a high-density plasma chemical vapor deposition (HDPCVD). It is performed in a chemical vapor deposition chamber. Whether utilizing PECVD or HDPCVD, a method of forming the fluorine silicate glass layer 24 is well known to those skilled in the art. As a result, details of forming the fluorine silicate glass layer 24 are not discussed further.

In the present invention, on completing the formation of the fluorine silicate glass layer 24, an oxygen-containing plasma is immediately utilized, such as $N_2O$, $O_2$, CO, $CO_2$ etc, in-situ removing fluorine ions in an upper surface (about 100 to 200 Å) of the fluorine silicate glass layer 24 to form a thin silicon oxide layer 26. In the preferred embodiment of the present invention, a thickness of the silicon oxide layer 26 is about 120 Å. Noticeably, the thickness of the silicon oxide layer 26 is at least higher than 100 Å; otherwise it will lose the ability to prevent fluorine ions from out-diffusion. What is called "in-situ removing" refers to a formation of the fluorine silicate glass film 24 and the silicon oxide layer 26 in the same chemical vapor deposition chamber. Further, the silicon oxide layer 26 that is produced by utilizing $N_2O$ plasma to remove fluorine ions is formed immediately after deposition of the fluorine silicate glass layer 24. A plasma pressure between 0.1 and 10 Torr, optimal 2.4 Torr, a plasma power between 0.5 and 10 Watt/cm$^2$, optimal 4.8 Watt/cm$^2$, a temperature of plasma between 250 and 450° C., optimal 400° C., and a treating time of 10 seconds are required.

As shown in FIG. 5, a photoresist layer 28 is coated on the silicon oxide layer 26. Then a pre-determined latent pattern is formed in the photoresist layer 28 by performing an exposing process. After a developing process, corresponding portions of the silicon oxide layer 26 underneath the pre-determined latent pattern are exposed. Finally, an etching process removes the silicon oxide layer and the fluorine silicate glass layer that are uncovered by the photoresist. Transferring a pre-determined latent pattern to a semiconductor wafer is completed. In the present invention, the photoresist layer 28 is composed of a positive photoresist or a negative photoresist. As the photoresist layer 28 is composed of a positive photoresist, light passes through a mask and is projected to the photoresist layer 28 to form a latent pattern during an exposing process. Following a development and cleaning process, portions of the photoresist layer 28 that are not projected by light, are left on the wafer and serve as a hard mask having a pattern the same as the mask. On the contrary, as the photoresist layer 28 is composed of a negative photoresist, portions of the photoresist layer 28, which are not projected by light, are removed in a following development and cleaning process. Remaining photoresist layer 28 forms a hard mask having a complementary pattern of the mask.

Please refer to Table 1. Table 1 shows a comparison of the physical properties between PEFSG and PEFSG ($N_2O$ plasma). Therein PEFSG represents the fluorine silicate glass without any treatment and PEFSG ($N_2O$ plasma) represents the fluorine silicate glass with an oxygen-plasma treatment. As shown in Table 1, physical properties, such as thickness, refractive index, dielectric constant and so on, of the fluorine silicate glass film treated with an oxygen-containing plasma are almost the same as the fluorine silicate glass without any treatment. As a result, in-situ removing of fluorine ions of the fluorine silicate glass filmdoes not change physical properties of the fluorine silicate glass film.

Figure 6:
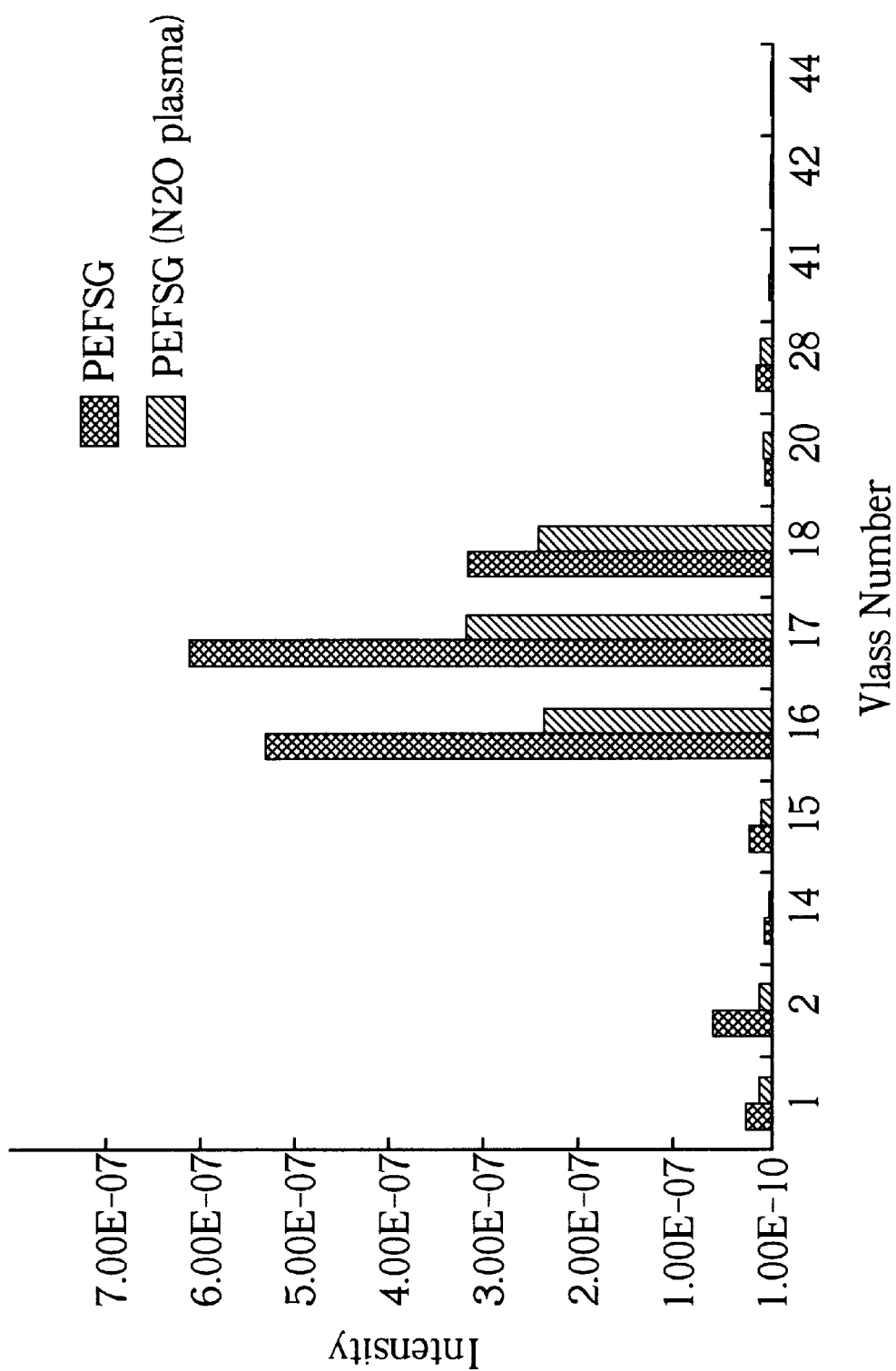
FIG. 6 is a schematic diagram of a composition of substances on the fluorine silicate glass film surface. Therein PEFSG represents the fluorine silicate glass without any treatment and PEFSG ($N_2O$ plasma) represents the fluorine silicate glass film with an oxygen-plasma treatment.

Please refer to FIG. 6. FIG. 6 is a schematic diagram of composition of substances on the fluorine silicate glass film surface. Wherein PEFSG represents the fluorine silicate glass without any treatment and PEFSG ($N_2O$ plasma) represents the fluorine silicate glass with an oxygen-containing plasma treatment. As shown in FIG. 6, a mass of substances on fluorine silicate glass almost centers on 16, 17 and 18, which represent oxygen atoms (16), OH radicals (17), $H_2O$ molecules (18). It appears that a fluorine silicate glass surface with an oxygen-containing plasma treatment has less water molecules. As a result, the oxygen-containing plasma treatment reduces the water absorption capability of the fluorine silicate glass surface and further reduces a probability of fluorine ions combining with water to form hydrofluoric acid. As shown in Table 1 and FIG. 6, in-situ removing fluorine ions of the fluorine silicate glass film does not change physical properties of the fluorine silicate glass film but can effectively reduce probability of fluorine ions combining with water to form hydrofluoric acid.

Compared to the prior art, the present invention utilizes an oxygen-containing plasma to in-situ remove fluorine ions from an upper surface of the fluorine silicate glass layer 24 to form the silicon oxide layer 26. Furthermore, the present invention solves a problem of fluorine ions in the fluorine silicate glass layer 24 diffusing to the surface of the fluorine silicate glass layer 24 to combine with water to form hydrofluoric acid, which would poison the photoresist and lead to reliability issues. More particularly, utilizing an oxygen-containing plasma in-situ removing fluorine ions right after the formation of the fluorine silicate glass layer 24 reduces the number of process steps and production cost.

The above disclosure is a preferred embodiment of the present invention. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of a surface treatment on a fluorinated silicate glass (FSG) film, the method comprising:

depositing a fluorinated silicate glass (FSG) film over a wafer;

in-situ removing fluorine ions in an upper surface of the FSG film to form a silicon oxide layer having a predetermined thickness through use of oxygen-containing plasma;

coating a photoresist on the silicon oxide layer;

exposing the photoresist to form a latent pattern in the photoresist; and developing the photoresist to remove the latent pattern of the photoresist so as to expose corresponding portions of the silicon oxide underneath the latent pattern of the photoresist.

2. The method of claim 1 wherein the silicon oxide has a thickness greater than 100 angstroms.

3. The method of claim 1 wherein an oxygen source gas of the oxygen-containing plasma is selected from a group consisting of $N_2O$, $O_2$, CO, and $CO_2$.

4. The method of claim 1 wherein operational conditions for creating the oxygen-containing plasma comprise;

(a) a plasma pressure from 0.1 to 10 Torr;

(b) a plasma power from 0.5 to 10 w/cm2; and (c) a plasma temperature from 250 to 450° C.

5. The method of claim 1 wherein the FSG film and the silicon oxide layer are formed in one chemical vapor deposition (CVD) chamber.

6. A method of a surface treatment on a fluorinated silicate glass (FSG) film, the method comprising:

depositing a fluorinated silicate glass (FSG) film over a wafer in a chemical vapor deposition (CVD) chamber;

in-situ removing fluorine ions in an upper surface of the FSG film in the CVD chamber to form a silicon oxide layer having a thickness greater than 100 angstroms through use of oxygen-containing plasma;

coating a photoresist on the silicon oxide layer;

exposing the photoresist to form a latent pattern in the photoresist; and developing the photoresist to remove the latent pattern of the photoresist so as to expose corresponding portions of the silicon oxide underneath the latent pattern of the photoresist.

7. The method of claim 6 wherein the CVD chamber is a plasma enhanced chemical vapor deposition (PECVD) chamber.

8. The method of claim 6 wherein the CVD chamber is a high density plasma chemical vapor deposition (HDPCVD) chamber.

9. The method of claim 6 wherein an oxygen source gas of the oxygen-containing plasma is selected from a group consisting of $N_2O$, $O_2$, CO, and $CO_2$.

10. The method of claim 6 wherein operational conditions for creating the oxygen-containing plasma comprise:

(a) a plasma pressure from 0.1 to 10 Torr;

(b) a plasma power from 0.5 to 10 W/cm2; and (c) a plasma temperature from 250 to 450° C.

11. The method of claim 6 wherein the FSG film and the silicon oxide layer thereon have a measured combined dielectric constant that is less than 3.6.

* * * * *